United States Patent [19]

Dyer et al.

[11] 4,115,120
[45] Sep. 19, 1978

[54] METHOD OF FORMING THIN FILM PATTERNS BY DIFFERENTIAL PRE-BAKING OF RESIST

[75] Inventors: Donald R. Dyer, Wappingers Falls; Claude Johnson, Jr., Yorktown Heights; Robert R. Wilbarg, Hopewell Junction, all of N.Y.

[73] Assignee: International Business Machines Corporation, Armonk, N.Y.

[21] Appl. No.: 837,675

[22] Filed: Sep. 29, 1977

[51] Int. Cl.$^2$ .............................................. G03C 5/00
[52] U.S. Cl. ....................................... 96/36.2; 96/36; 156/659; 204/15; 427/88; 427/282; 427/314
[58] Field of Search .................. 96/36, 36.2; 156/633, 156/640, 659; 427/314, 88, 282; 204/15

[56] References Cited

U.S. PATENT DOCUMENTS

| 3,669,661 | 6/1972 | Page et al. ............................ 96/36.2 |
| 3,799,777 | 3/1974 | O'Keefe et al. ...................... 96/36.2 |
| 3,867,148 | 2/1975 | O'Keefe et al. ...................... 96/36.2 |

OTHER PUBLICATIONS

"Introduction to Photofabrication Using Kodak Photosensitive Resists", Aug., 1967, p. 21.
De Forest, "Photoresist", pp. 229-232, Jun. 1965.

*Primary Examiner*—Edward C. Kimlin
*Attorney, Agent, or Firm*—J. B. Kraft

[57] ABSTRACT

A method of depositing patterned thin films on an integrated circuit substrate which comprises first forming a layer of positive photoresist material on the substrate and then heating to partially cure the photoresist while maintaining the surface of the photoresist interfacing with the substrate at a lower temperature than the opposite surface of the photoresist which is being exposed to the heat. As a result of this expedient, the upper or exposed portion of the photoresist layer is cured to a greater extent than the lower portion at the interface with the substrate. Then, the photoresist layer is exposed to a selected pattern of light, after which developer for the photoresist material is applied. The developer will remove the less cured interfacing portion of the photoresist layer at a higher rate than the more cured upper layer to thereby form an aperture pattern through the photoresist layer corresponding to the light pattern wherein the apertures are respectively narrower at the opposite or exposed surface than at said interfacing surface. This produces the negative slope or "overhang" type lift-off mask which is considered to be critical to forming thin film patterns by lift-off techniques. Then, the selected thin film is deposited onto said substrate through the apertures utilizing the photoresist mask as a deposition mask, after which the remainder of the photoresist layer is removed, leaving the thin film pattern on the substrate.

6 Claims, 7 Drawing Figures

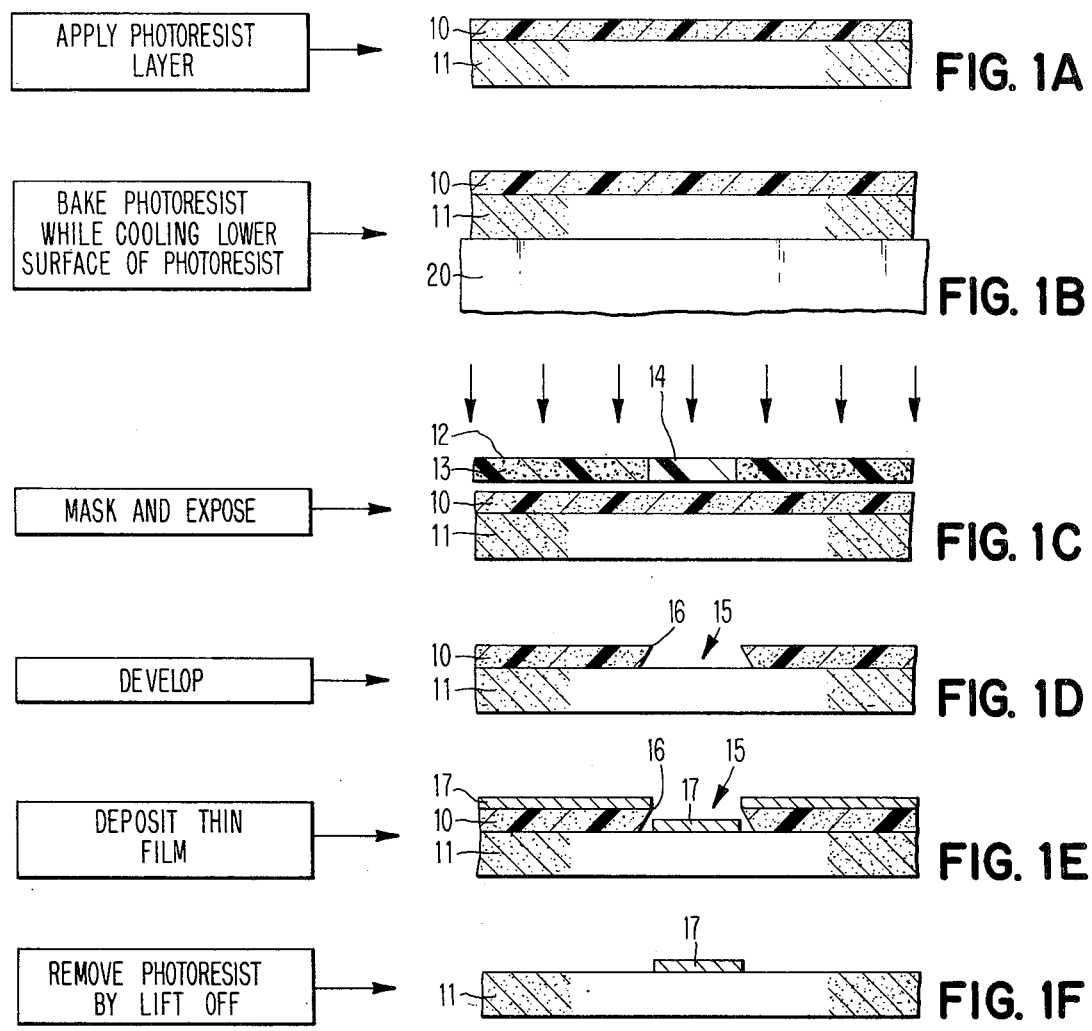
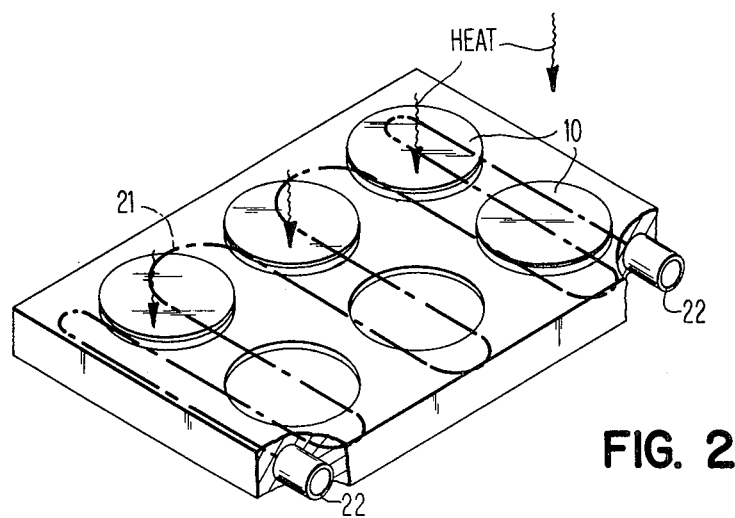

METHOD OF FORMING THIN FILM PATTERNS BY DIFFERENTIAL PRE-BAKING OF RESIST

BACKGROUND OF INVENTION

This invention relates to a method of forming thin film patterns, particularly thin films such as metallic films, in the fabrication of integrated circuits.

Most present techniques in the formation of vacuum deposited thin metallic film patterns make the use of etching in the presence of etch-resist photoresist layers to provide the selected pattern. This, in effect, involves the traditional photoengraving or photolithographic etching process. However, with the continued miniaturization of semiconductor integrated circuits to achieve greater component density and smaller units in large scale integrated circuitry, the art is rapidly approaching a point where such photolithographic etching of deposited film may be impractical for providing the minute resolution required for the fine linework of metallization, particularly at metal thicknesses in the order of 8,000 A – 25,000 A, in such large scale integrated circuitry.

An alternative method for forming such metallization in large scale integrated circuitry, which is presently under consideration and use in the art, is commonly denoted by the term "expendable mask method", "lift-off method", or "stencil method". The following references are typical of those describing these known types of methods.

1. T. D. Schlaback et al, "Printed and Integrated Circuitry", pp. 352-352, McGraw-Hill, New York, 1963.
2. K. C. Hu, "Expendable Mask: A New Technique for Patterning Evaporated Metal Films", *Electron Packaging and Production,* October 1967.
3. M. Hatzakis, "Electron Resist for Micro-Circuit and Mask Production", *Journal of The Electrochemical Society,* Vol. 116, p. 1033, 1969.
4. H. I. Smith et al, "A High-Yield Photolithographic Technique for Surface Wave Devices", *Journal of The Electrochemical Society,* Vol. 118, p. 821, 1971.

U.S. Pat. Nos. 3,849,136 and 3,982,943 are typical of patents directed to a lift-off method and structure for depositing thin films which avoid the "edge-tearing" problem by providing deposition masks with apertures having a negative slope or "overhang". Because of this overhang, when thin films, particularly metal films, are deposited over the structure and the remaining photoresist is removed by standard lift-off techniques, the "edge-tearing" problem is minimized. Both of these patents provide effective techniques for forming deposition masks with such "overhangs". However, they must use a series of depositions and etching steps in order to produce the final deposition mask with the desirable "overhang".

BRIEF SUMMARY OF THE PRESENT INVENTION

The present invention provides a method for forming thin patterned films by lift-off techniques in which the deposition mask with apertures having the desirable negative slope or overhang are produced by a simplified efficient technique.

Accordingly, it is the primary object of the present invention to provide an improved method for forming thin film patterns with well defined edges.

It is another object of the present invention to provide an improved lift-off method wherein the deposition mask is formed with apertures having the desirable "overhang" in a simplified manner.

In accordance with the method of the present invention, patterned thin films, particularly metal films, are formed on a substrate by a method comprising first forming a layer of positive photoresist material on said substrate and then heating to partially cure the photoresist while maintaining that surface of the photoresist layer interfacing with the substrate at a lower temperature than the opposite or exposed surface with said photoresist layer. Then, this partially cured photoresist layer is exposed to a selected pattern of light, after which developer for said photoresist material is applied to the layer to thereby form an aperture pattern through the layer corresponding to the light pattern in which the apertures are respectively narrower at the opposite or exposed surface than at the interfacing surface. Finally, thin films are deposited on the substrate through the apertures using the photoresist mask as a deposition mask, after which this desposition mask may be removed to lift-off the excess thin film material.

The key to the invention is, of course, the differential heating in the phototresist layer being partially cured by maintaining the portion of the photoresist layer at the interface at a lower temperature than the opposite surface of the layer. In this manner, the heating will cure the opposite or exposed surface of a photoresist layer to a greater extent than the surface of the photoresist layer at the interface. Consequently, after the photoresist layer has been exposed to the selected light pattern and developed, the developer will remove the less cured interfacing portion of photoresist to a greater extent than the more highly cured exposed photoresist surface to produce a pattern of apertures with a negative slope, i.e., apertures narrower at the exposed surface of the photoresist than at the lower interfacing surface. This results in the overhang which is critical for lift-off methods.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIGS. 1A-1F are diagrammatic fragmentary cross-sectional views of the structure being fabricated in accordance with the preferred embodiments of the present invention as well as a flow chart describing each of these steps.

FIG. 2 is a diagrammatic view with portions broken away of apparatus utilized in the differential heating step of the present invention.

DETAILED DESCRIPTION OF THE PREFERRED EMBODIMENTS

FIGS. 1A-1F show the formation of a mask in accordance with the present invention as well as the utilization of this mask for lift-off purposes. With reference to FIG. 1A, a layer of photoresist material 10 is formed on a semiconductor stubstrate 11. In the fabrication of integrated circuits, substrate 11 may be a semiconductor material or a semiconductor substrate having a surface layer of an electrically insulative material, such as silicon dioxide or silicon nitride. Layer 10 may be formed of a positive photoresist composition such as described in U.S. Pat. No. 3,666,473. Other photoresist compositions such as those described in U.S. Pat. No. 3,201,239 may also be used to form layer 10 in accordance with the present invention. The photoresist composition is applied to substrate 11 by conventional spin coating at about 4,000 RPM.

Next, the photoresist is baked, FIG. 1B, under the following conditions. With reference to FIG. 2, the wafers 10 with the photoresist 11 coated thereon are mounted on a structure in which the semiconductor substrate or wafer surface coated with the photoresist is exposed while the other surface is seated on a cooling member 20. Conveniently, the batch of wafers may be seated in recesses 21 in cooling member 20. In order to maintain the temperature differential on the photoresist coating 11 on the wafers while the wafer is being heated by conventional means, i.e., in an oven, cooling member 20 which may conveniently be made of a heat conductive material such as metal and may be cooled in any conventional manner, e.g., by liquid being circulated through coils 22 in any standard liquid cooling scheme, thermoelectric cooling could also be used.

In order to partially cure photoresist coating 10 so that the exposed surface of photoresist coating 10 is partially cured to a greater extent than the lower surface of coating 10 at the interface with substrate 11, the heating or curing cycle should be relatively short, i.e., in the order of from 40–60 seconds as compared to more conventional photoresist prebake or preliminary curing cycles which are in the order of from 5 to 30 minutes. With longer curing cycles it becomes more and more diffi-to maintain the temperature differential between the upper and lower surfaces of the photoresist layer 10 which is necessary for process of the present invention. For best results, using an apparatus like that of FIG. 2 the photoresist coated wafer is baked at a temperature from 120°–160° C. and preferably at about 140° C. for a period of from 30–60 seconds and preferably for 40 seconds, while the underside bottom of the wafer is maintained at a cooler temperature, e.g., about 20° C. With this temperature combination, the lower or interfacing surface of photoresist layer 10 should be maintained at a temperature at least 40° lower than the temperature of the exposed surface of photoresist layer. As a result of this differential curing step, FIG. 1B, photoresist layer 10, which for purposes of this embodiment has a thickness of about 2 microns, will be partially cured with a differential state of cure, i.e., photoresist at the upper surface of layer 10 will be cured to a greater extent than the photoresist at the lower surface which interfaces with the substrate 11.

Next, as shown in FIG. 1C, the structure is masked with a mask 12 having transparent regions 14 and opaque regions 13. The mask is shown in the illustration as being slightly offset from the surface merely for purposes of clarity. The exposure is to a 200 Watt mercury lamp for approximately 10 seconds. As a result of this exposure, the portion of photoresist layer 10 beneath transparent region 14 will become solubilized. The extent of solubilization will, of course, depend on the extent to which the photoresist layer has been partially cured during the previously described heating step.

Then, FIG. 1D, the structure is subjected to a developing step utilizing a conventional alkaline developer for positive photoresist, e.g., a 2.5% by weight solids in aqueous solution of a mixture of sodiummetasilicate and sodium phosphate, predominantly sodiumorthophosphate having a pH at room temperature in the order of 12.55 for about 30 seconds. As a result, apertures 15 will be formed through photoresist layer 10 in a pattern corresponding to the transparent portions 14 in mask 12. Each of the apertures will have a negative slope because the photoresist material at the bottom portion of the apertures will not be as extensively cured as the material in the upper portion, and thus the photoresist material in the bottom portion would be more extensively solubilized upon exposure to light in the previous step of 1C. Thus, the photoresist defining aperture 15 will have the overhang 16 required for effective lift-off processing.

Next, FIG. 1E, using photoresist layer 10 as a deposition mask for the substrate, a metallic film 17 is deposited at a temperature between room temperature and 100° C. Alternately, layer 17 may be an inorganic electrically insulative material such as silicon dioxide or silicon nitride. These insulative materials may be deposited in any conventional sputter deposition system. In the embodiment shown, a metallic film is used. The metal may be any metal conventionally used for integrated circuit metallization, e.g., aluminum-copper alloys, platinum, palladium, chromium, silver, tantalum, gold and titanium or combinations thereof. Metallic film 16 has a thickness in the order of 1 micron.

Next, FIG. 1F, using conventionl lift-off techniques, photoresist masking layer 10 is completely removed by immersion into a solvent, such as N-methylpyrrolidone, a standard photoresist stripping solvent for about 10 minutes using ultrasonic agitation. This leaves thin metal film 17 in the desired, preselected configuration. The solvent selected should be one which dissolves or swells the polymeric material of layer 10 without affecting the thin metallic film 17. Such solvents include acetone, butylacetate, trichlorethylene and Cellosolve acetate.

It should be noted that the term "thin film" as used in the present specification and claims is not meant to define any particular film thickness but rather to designate the thin film technology.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of depositing patterned thin films on a substrate comprising:
    forming a layer of positive photoresist material on said substrate,
    heating to partially cure said photoresist while maintaining the surface of said photoresist layer interfacing with said substrate at a lower temperature than the opposite surface of said layer,
    exposing said photoresist layer to a selected pattern of light,
    applying developer for said photoresist material to said layer to thereby form an aperture pattern through said layer corresponding to said light pattern wherein said apertures are respectively narrower at said opposite surface than at said interface, and
    depositing said thin films onto said substrate through said apertures using said photoresist mask as a deposition mask.

2. The method of claim 1 wherein said substrate is an integrated semiconductor member.

3. The method of claim 2 wherein said member is covered with a layer of electrically insulative material.

4. The method of claim 2 wherein said thin films are metallic.

5. The method of claim 4 including the further step or removing the remainder of the photoresist layer after the deposition of said thin films.

6. The method of claim 5 wherein said opposite surface of said photoresist layer is subjected to a temperature of from 120° to 160° C. while interfacing surface of said layer is maintained at least 40° C. below said temperature.

* * * * *